(12) United States Patent
Sippola

(10) Patent No.: US 7,205,655 B2
(45) Date of Patent: Apr. 17, 2007

(54) MULTILAYER CIRCUIT INCLUDING STACKED LAYERS OF INSULATING MATERIAL AND CONDUCTIVE SECTIONS

(75) Inventor: Mika Sippola, Helsinki (FI)

(73) Assignee: Schaffner EMV AG, Luterbach (CH)

( * ) Notice: Subject to any disclaimer, the term of this patent is extended or adjusted under 35 U.S.C. 154(b) by 4 days.

(21) Appl. No.: 10/806,269

(22) Filed: Mar. 23, 2004

(65) Prior Publication Data

US 2004/0178489 A1 Sep. 16, 2004

Related U.S. Application Data

(63) Continuation of application No. PCT/EP02/11839, filed on Oct. 23, 2002.

(30) Foreign Application Priority Data

Oct. 23, 2001 (FI) .................................. 20012052

(51) Int. Cl.
  *H01L 23/12* (2006.01)
(52) U.S. Cl. ................. 257/723; 257/686; 257/E23.003
(58) Field of Classification Search ......... 257/666–733
See application file for complete search history.

(56) References Cited

U.S. PATENT DOCUMENTS

| 3,484,731 | A |   | 12/1969 | Rich, III |
|---|---|---|---|---|
| 5,017,902 | A |   | 5/1991 | Yerman et al. |
| 5,276,421 | A |   | 1/1994 | Boitard |
| 5,381,124 | A |   | 1/1995 | Roshen |
| 5,521,573 | A |   | 5/1996 | Inoh et al. |
| 5,781,093 | A |   | 7/1998 | Grandmont et al. |
| 5,801,611 | A |   | 9/1998 | Van Loenen et al. |
| 6,225,688 | B1 | * | 5/2001 | Kim et al. ................... 257/686 |
| 2002/0030975 | A1 | * | 3/2002 | Moon .......................... 361/749 |
| 2002/0044423 | A1 | * | 4/2002 | Primavera et al. .......... 361/704 |

FOREIGN PATENT DOCUMENTS

| EP | 0035964 A1 | 2/1981 |
|---|---|---|
| EP | 0689214 | 6/1995 |
| EP | 0 786 784 A1 | 10/1996 |
| GB | 2 255 451 A | 5/1991 |
| WO | WO 98/15160 | 4/1998 |
| WO | WO 01/16970 A1 | 8/2000 |

\* cited by examiner

*Primary Examiner*—Marcos D. Pizarro
(74) *Attorney, Agent, or Firm*—Blank Rome LLP

(57) ABSTRACT

The invention relates to the manufacturing of a multilayer structure and especially it relates to the manufacturing of a three-dimensional structure and its use as an electronics assembly substrate and as a winding for transformers and inductors. When a multilayer structure is manufactured by folding a conductor-insulator-conductor laminate, where the conductor layers to be separated from each other follow each other on opposite sides of the conductor-insulator-conductor laminate in the sections following each other and where the insulator has been removed from the places where the conductor layers are to be connected together after folding, it is possible to manufacture a wide range of three-dimensional multilayer structures where the volume occupied by the windings over the total volume can be maximized. Alternatively, by using the method it is also possible to manufacture a multilayer structure where components have been buried inside. The method makes it also possible to make connections between layers in a flexible manner. Among other issues, the method can be easily automated for mass-production.

15 Claims, 5 Drawing Sheets

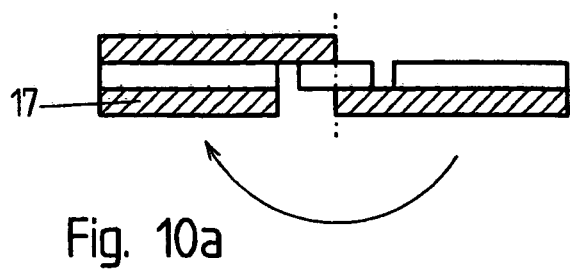
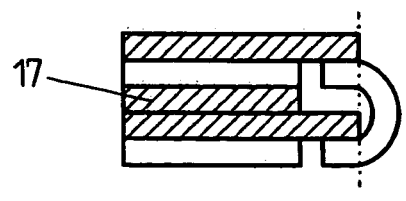
Fig. 10a    Fig. 10b
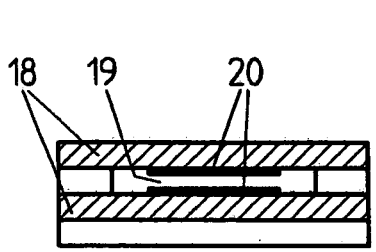
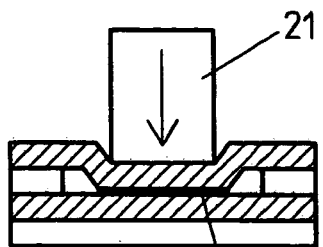
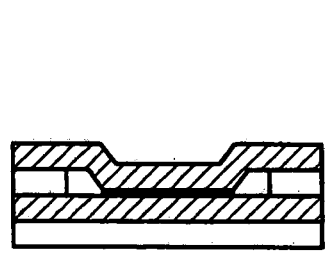
Fig. 11a    Fig. 11b    Fig. 11c
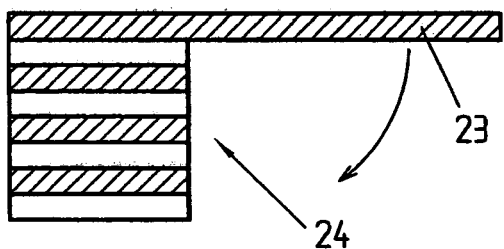
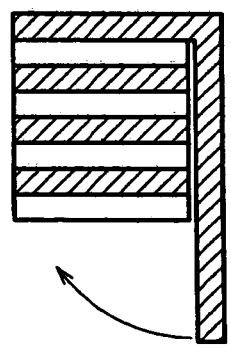
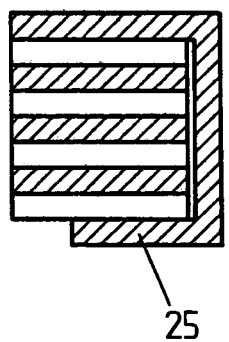
Fig. 12a    Fig. 12b    Fig. 12c
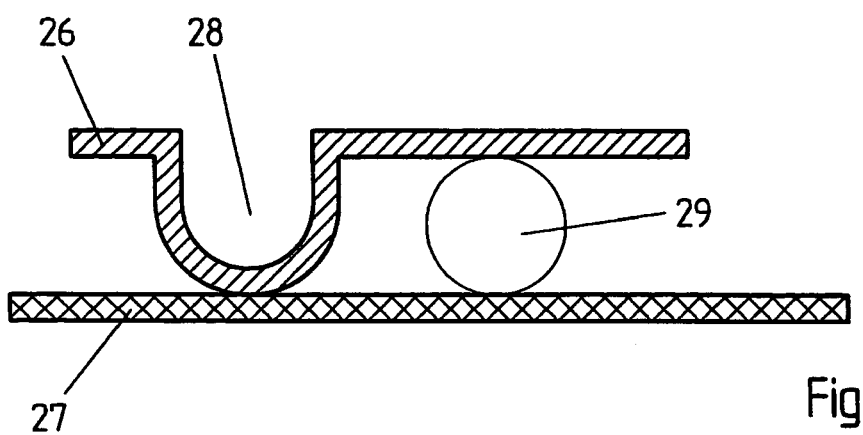
Fig. 13

MULTILAYER CIRCUIT INCLUDING STACKED LAYERS OF INSULATING MATERIAL AND CONDUCTIVE SECTIONS

REFERENCE DATA

This application is a continuation of application PCT/EP02/11839 (WO03/036664), filed on Oct. 23, 2002, claiming priority of application FI20012052 of Oct. 23, 2001, the contents of which are hereby incorporated by reference.

FIELD OF THE INVENTION

The invention relates to the manufacturing of a multilayer structure and in particular to the manufacturing of a three dimensional structure and its use as an electronics assembly substrate and as a winding for transformers and inductors.

DESCRIPTION OF RELATED ART

Printed circuit boards are often used in electronics as substrate and to form electrical connections between components. Most commonly such circuit boards are manufactured by etching the preferred conductor pattern on a copper-insulator (copper-FR4) laminate and by drilling holes and through-plating them in order to form electrical connections from one side of the circuit board to the other. Multilayer printed circuit boards are manufactured by stacking and connecting multiples of such boards on top of each other with prepreg-layers under heat and compression.

Such an assembly process is usually manual and includes many critical operations, in particular concerning the alignment between the layers. In patent application GB 2 255 451 it is shown how the layers to be stacked together are aligned by using special "alignment pins". In patent application WO 98/15160 a completely automatic assembly process based on use of a continuous strip of material is shown.

Multilayer printed circuit boards are also used for inductive components such as inductors and transformer windings. The benefit of such a planar inductive component is for example its low profile and high power density.

In patent applications EP0689214, WO01/16970, U.S. Pat. No. 5,781,093 and U.S. Pat. No. 5,521,573, it is shown how such a planar winding is manufactured by stacking conductor layers on top of each other and by connecting the different layers in proper fashion. Between conductor layers, an insulator may also be placed in order to keep conductors separated and to prevent short circuits. However, in practice such a structure is difficult to manufacture, which results in high manufacturing costs. Further, because of the use of many insulator layers, the copper fill factor i.e. the ratio of copper volume to the total volume available for the windings may remain low. This increases the losses and reduces the power density of a transformer. Also, the contact bolts and plated through holes for connections take away space from actual windings.

An alternative method for manufacturing a multilayer winding structure has been presented for example in patent applications U.S. Pat. No. 3,484,731, U.S. Pat. No. 5,801,611, EP0786784, U.S. Pat. No. 5,276,421 and U.S. Pat. No. 5,017,902, where a thin and flexible insulator-conductor laminate is folded (z-folding, zigzag folding) several times to form a multilayer structure. In these solutions as well, an insulating layer has to be placed on the laminate prior to folding, which reduces the copper fill factor and thus the transformer power density and also makes the manufacturing process more complicated.

BRIEF SUMMARY OF THE INVENTION

One aim of the present invention is to make the manufacture of such multilayer structures easier and to increase the power density of inductive components manufactured. Such aim is achieved by the device provided by claim 1 and by the method provided by claim 14.

By using the method according to invention it is possible to manufacture three-dimensional multilayer structures with high a copper fill factor in a flexible manner. Alternatively, it is also possible to manufacture a multilayer structure into which components have been buried. The method allows connections to be formed conveniently between winding layers. The method is also easy to automate for mass production.

In an embodiment of the invention, the multilayer structure is manufactured by using a copper-kapton-copper laminate with a reel-to-reel type process. First the winding patterns are formed to the laminate by chemical etching. The laminate consists of consecutive segments corresponding to the separate layers of the final multilayer structure; the copper is removed at least from the points that are later to be connected to other layers on the top side of even numbered segments and on the bottom side of odd numbered segments. In addition to this, copper is also removed to form winding patterns. Next the kapton insulator is removed from appropriate places, for example where contacts between winding layers are later to be formed. This may also be done using photolithography. After this, the laminate is folded and compressed along the edges of the imagined segments. Winding layers are then connected together by using a rivet or by an equivalent connection means, like a solder joint.

In another embodiment of the invention, other electronics components have also been connected to the laminate before folding and at least some of these components will be buried inside the multilayer structure when the laminate is folded.

A planar component or integrated power converter can be manufactured by placing ferrite halves around the multilayer winding structure.

BRIEF DESCRIPTION OF THE DRAWINGS

The invention will now be explained in more detail with reference to the following illustrative figures where:

FIGS. 10A and B illustrate how the copper thickness can be doubled when a conductor 17 is used in the both side of the laminate;

FIGS. 11A,B and C illustrate how a solder connection 22 is made between conductor layers 18 to a point 19 where the insulator has been removed by plating the conductors with solder 20 and by pressing them together with a hot tool 21;

FIG. 12 illustrates how a conductor extension 23 is flipped under the multilayer structure 24 for connection purposes;

FIG. 13 illustrates how a contact can be formed between a conductor layer 26 and a circuit board 27 by using a mechanically formed dimple 28 or interconnection ball 29;

DETAILED DESCRIPTION OF THE INVENTION

Figure 1:
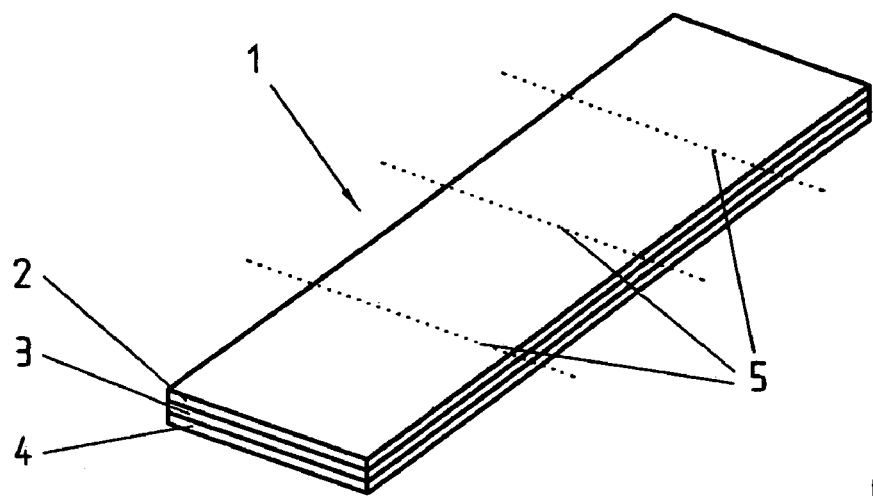
FIG. 1 illustrates a conductor-insulator-conductor laminate 1 as a three-dimensional projection where also the edges 5 of the imagined segments have been marked.
Figure 2:
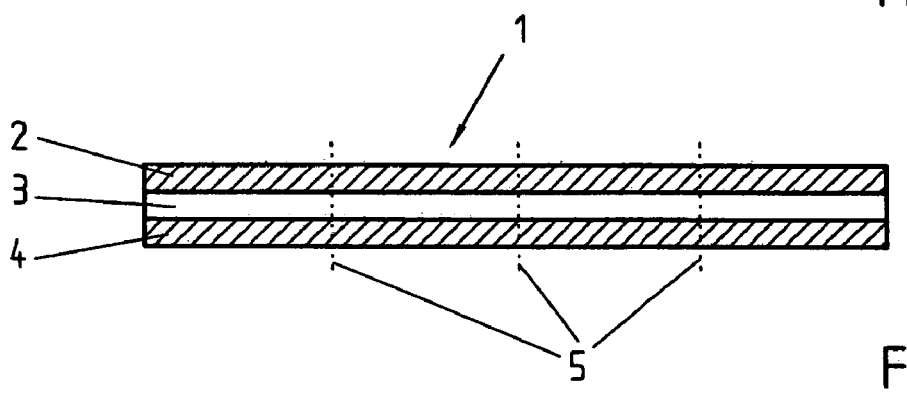
FIG. 2 illustrates a conductor-insulator-conductor laminate 1 as a side view where the edges 5 of the imagined segments have been marked.

Reel-to-reel type processing is effective to use in manufacturing. The laminate is guided through the different process steps as a continuous strip. This eliminates many manual handling and alignment problems. Semi-finished products can also be stored and shipped between the various process steps in/on the reels. In FIG. 1, a projection of copper-kapton-copper laminate 1 (commonly called FLEX-laminate) is shown with copper 2, 4 and kapton 3 thicknesses of 75 μm and 25 μm, respectively. In FIG. 2, a cross section of such a laminate is also shown. Laminate like this is available on reels and its further processing is easy to automate. The intention is to process the laminate into the segments 5 which finally form the layers of the multilayer structure.

Figure 3:
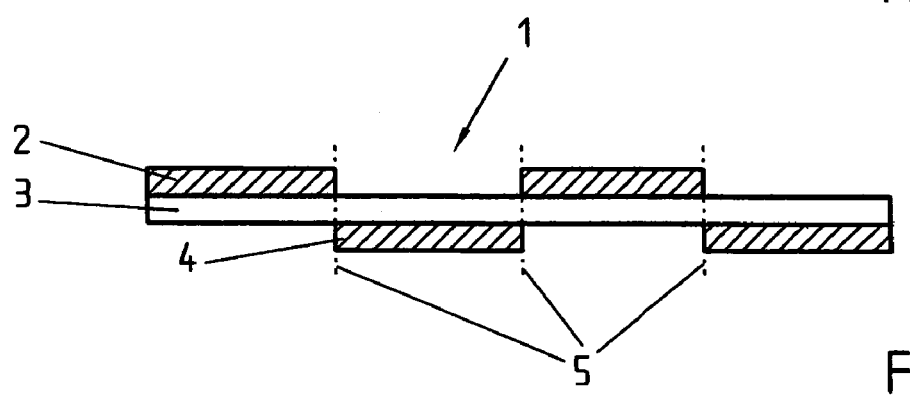
FIG. 3 illustrates a conductor-insulator-conductor laminate 1 as a side view where the edges 5 of the imagined segments have been marked after copper has been removed from the top and bottom side of the laminate.
Figure 4:
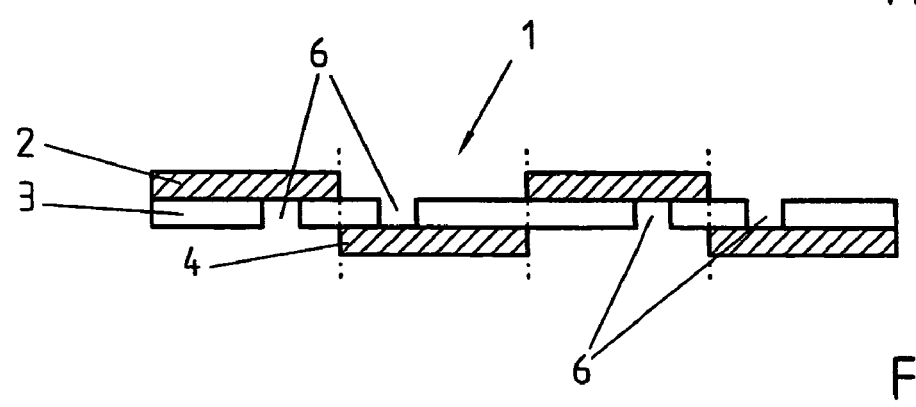
FIG. 4 illustrates a conductor-insulator-conductor laminate 1 as a side view after copper has been removed from the top and bottom side of the laminate and also some insulator has been removed from the places 6.

Processing begins as shown in FIG. 3 by forming the intended conductor pattern into two conductor layers 2 and 4 so that the conductor is alternately removed from the bottom and top sides of the insulator 3 from each segment. Generally speaking, this occurs at least from the places where connections between conductor layers will later be formed. The intention of the figures here is only to illustrate the manufacturing method, and the details of the conductor patterns are not considered. The removal of the conductor in places 2 and 4 reveals the insulating layer 3 where apertures 6 can be made into the insulator 3 according to FIG. 4. Apertures 6 can be formed for example by mechanical drilling, with laser or by etching with plasma or suitable chemical etching bath. It is also possible to pattern conductor layers 2 and 4 in multiple steps and for example to use conductor layers 2 and 4 as etching masks when apertures 6 are formed into insulator 3. The insulator 3 can also be etched in multiple steps. Other electronics manufacturing methods, such as additive conductor build up, photo-definable insulation; mechanical forming and lamination methods can also be used. Various different insulator, conductor and solder materials can also be used in manufacturing.

Figure 5:
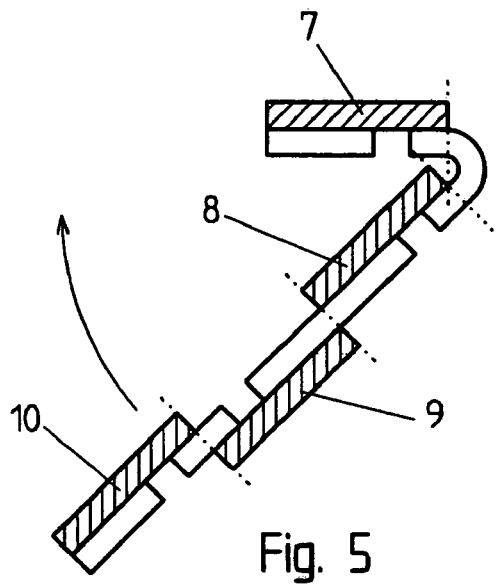
FIG. 5 illustrates how the segments 7 and 8 are folded relative to each other.
Figure 6:
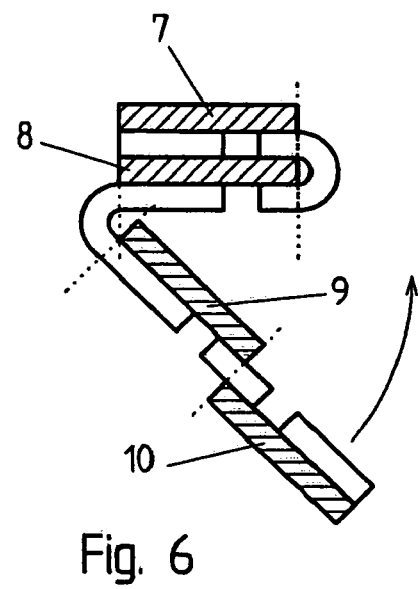
FIG. 6 illustrates how the segments 9 and 10 are folded relative to each other.
Figure 7:
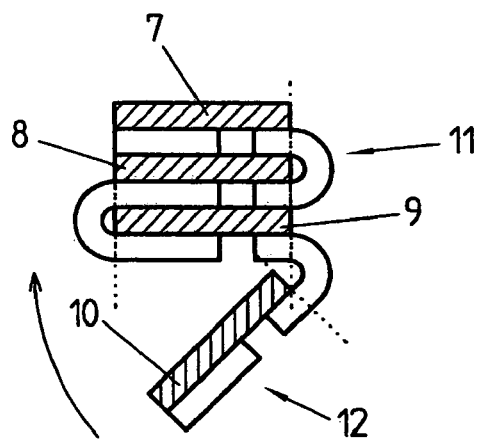
FIG. 7 illustrates how the segments 11 and 12 are folded relative to each other.
Figure 8:
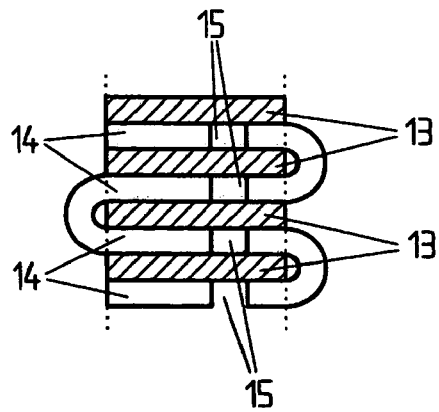
FIG. 8 illustrates a folded multilayer structure with conductor layers 13, insulator layers 14 and interconnection apertures 15.

The processed laminate is next folded stage by stage according to FIGS. 5, 6 and 7 resulting in a multilayer structure (FIG. 8) where the insulator 14 and the conductor 13 layers alternate. The laminate bends easily at the right place as the discontinuous conductor layers form a place for bending and also align the layers to some degree.

As seen in FIGS. 5–8, the alternation of conductor segments on different sides of the laminate results in inherent insulation between the conductor layers. Also, at no stage did an insulation layer need to be placed on the conductors. This reduces the thickness of the multilayer structure, when compared with the known structures obtained with other methods requiring an additional insulator layers. As additional insulator layers are not needed, the copper fill factor and the power density are increased. The winding layers following each other are also insulated from each other at the segment edges at folding lines due to the folded but continuous insulator. Folding does not have to be done in one direction only but can be accomplished at any other angle or angles to the main direction of laminate as well.

Figure 9:
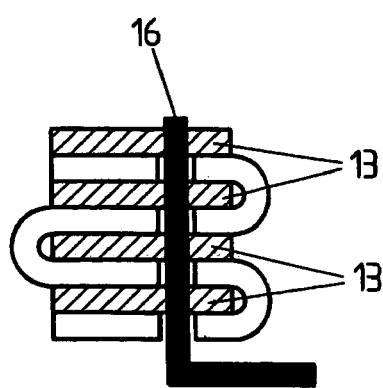
FIG. 9 illustrates a multilayer structure where conductor layers 13 are connected with a rivet 16 which also has an extension for further mounting purposes.

The winding layers on top of each other are seen individually through the apertures 15, and the winding layers 13 can be contacted together for example with a rivet 16 which punches the conductors at the apertures according to FIG. 9. The rivet is formed to provide soldering possibility to a printed circuit board as well.

The above-mentioned multilayer structure can also be manufactured in a manner where, at the segments following each other, there is first conductor on both sides of the laminate and then there is a segment without conductor on any side. However, in this case the access to the insulation layer for processing may be more difficult than as mentioned above.

Also, in some cases prepatterned copper strips may be laminated on a sheet of kapton, in order to directly obtain the printed FLEX laminate without the above etching process.

The apertures 6 may also be formed on the kapton before the lamination of the conductive layers.

A multilayer circuit according to the invention comprises therefore a flexible sheet of insulating material 3 having two sides, wherein sections of electrical circuit 7,8,9 are attached to both of said two sides, wherein said flexible sheet 3 is folded along folding lines 5, which divide said flexible sheet 3 into consecutive segments, in order to form a multilayer structure comprising conductor layers 13 and insulator layers 14 stacked above each other.

In a variant of the invention at least two consecutive sections of electric circuit that must be insulated from each other are disposed on different sides of said flexible sheet 3.

In another variant of the invention the greater part of the consecutive sections of electric circuit that must be insulated from each other are disposed on different sides of said flexible sheet 3.

In another variant of the invention special arrangements will be required for the top and bottom layers, and all consecutive sections of electric circuit not lying on said top and bottom layers and that must be insulated from each other are disposed on different sides of said flexible sheet 3.

Finally, in another variant of the invention, all consecutive sections of electric circuit not lying on said top and bottom layers and that must be insulated from each other are disposed on different sides of said flexible sheet 3.

In FIGS. 10A and 10B, it is shown how the conductor thickness of a multilayer structure can be doubled, for example to reduce winding resistance, but by still using a laminate with the original copper thickness. The conductor has been removed especially on the top of the right side segment. On the left side, the conductor has been removed only to give access to the insulator for processing; if compared with the laminate in FIG. 3, it should be noted that the conductor 17 is now located below the left side segment.

After folding, this conductor will contact with the conductor in the next segment and, in this case, they will be placed on top of each other resulting in the copper thickness doubling. In other words, the conductor patterns on the same side of the segments following each other can be connected together. If the layers connected to each other are further contacted permanently together, for example by using a soldered connection, the mechanical stability of the folded structure will be improved.

Apart from the rivet contact presented above, a more flexible and efficient method is to contact consequent winding layers together already as the folding proceeds. This makes it possible to manufacture so called "buries vias" where only some of the winding layers come in contact together at each connection point. In FIG. 11A, the contact points 19 of the conductor patterns 18 have been plated with solder 20. In FIG. 11B, the conductor layers are pressed together for contact 22 using a tool 21. The tool can for example be a soldering iron or an ultrasound tool. The finished connection according to FIG. 11C is reliable since the flexibility of the multilayer structure reduces stresses that may for example be due to thermal expansion. The method also does not require the realization of plated through holes. Low contact resistance between layers can be obtained. As an additional benefit, connections between layers stabilize the structure. Folding edges outside the structure, or some of them, can be cut away after folding. Conductor layers can also be mechanically formed, for example to have extensions or dimples which can then connect together and form a connection. Apertures 6 can also be filled with solder paste or solder to form interconnections by simply heating the folded structure.

In order to connect the finished multilayer structure 24 to the circuit board as a surface mounted component, it can be provided with a solder extension 23 which is then folded under the component to position 25 according to FIGS. 12A, 12B and 12C. Some layers of the structure can also be provided with mechanical dimples 28 or connection terminals 26 or interconnection balls 29 to provide electrical and mechanical contact to the substrate, as illustrated in FIG. 13. A conductor pattern on the outermost surface may also be used as sufficient interconnection surface. Connection extensions 23 can be used to provide both internal and external connections to the multilayer structure.

Figure 17A:
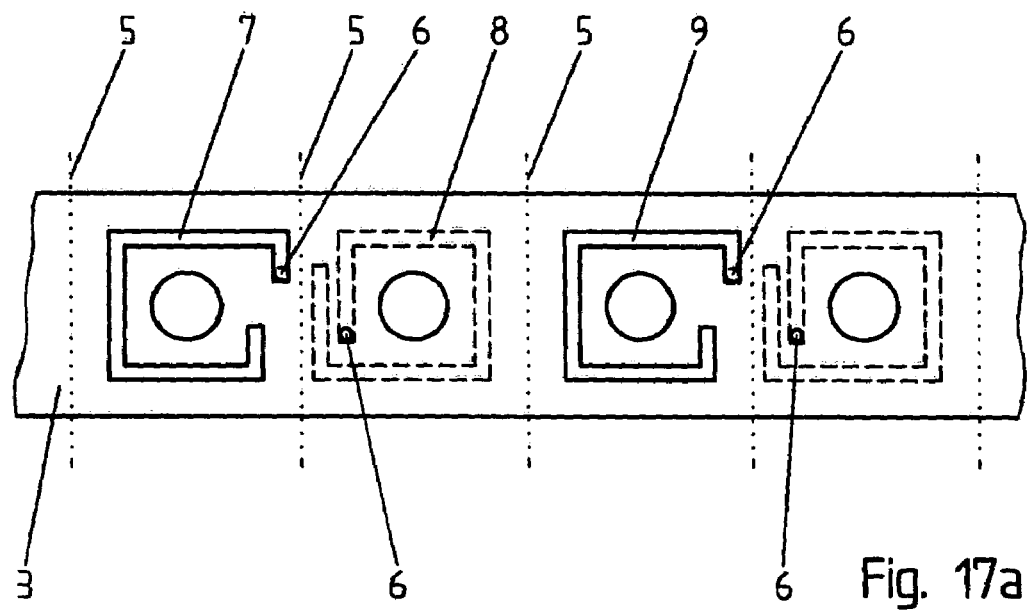
FIGS. 17a and 17b illustrate two multilayer structures according to the invention in their unfolded state.
Figure 17B:
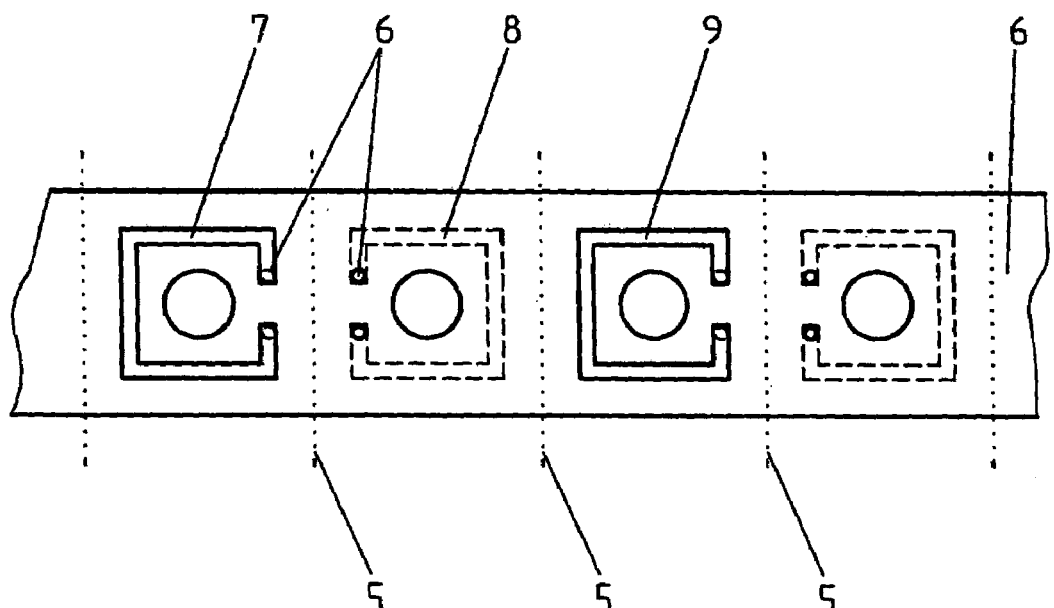

FIGS. 17a and 17b illustrate two further embodiment of the present invention, in which the flexible etched laminate is shown in its unfolded state, before the folding operation.

FIG. 17a shows a circuit in which each of the segment of circuit 7,8,9 constitutes one turn each, and all the turns are connected in series in order to form a high-inductance coil. While the structure is folded, electrical connections between segments of circuit are realized at the etched apertures 6 by the creation of "buried vias", for example by the method explained in the precedent embodiment. The center holes are found in aligned positions once the folding is complete and allow the insertion, for example, of a magnetic core.

FIG. 17b shows another circuit in which each segment of circuit 7,8,9 constitutes one turn each, and all the turns are connected in parallel, in order to form a coil of high current capability. In this case all the etched apertures 6 corresponding to one pole of the coil are aligned; and the connection can be obtained with the insertion of rivets, like in the method illustrated in FIG. 9.

By adding magnetic components such as ferrites to the multilayer structure, an inductive component is obtained. Ferrite components can be attached to the structure before or after the folding.

The method makes it possible to manufacture other components such as capacitors and resistors and combinations thereof such as integrated LC-components, as well as for example to make filters of small size. In other words, the conductors of the multilayer structure can also be used both as windings of an inductive component and as capacitor plates of a capacitor. It may also be efficient to use the same laminate to manufacture multiple separate components at the same time.

Figure 14:
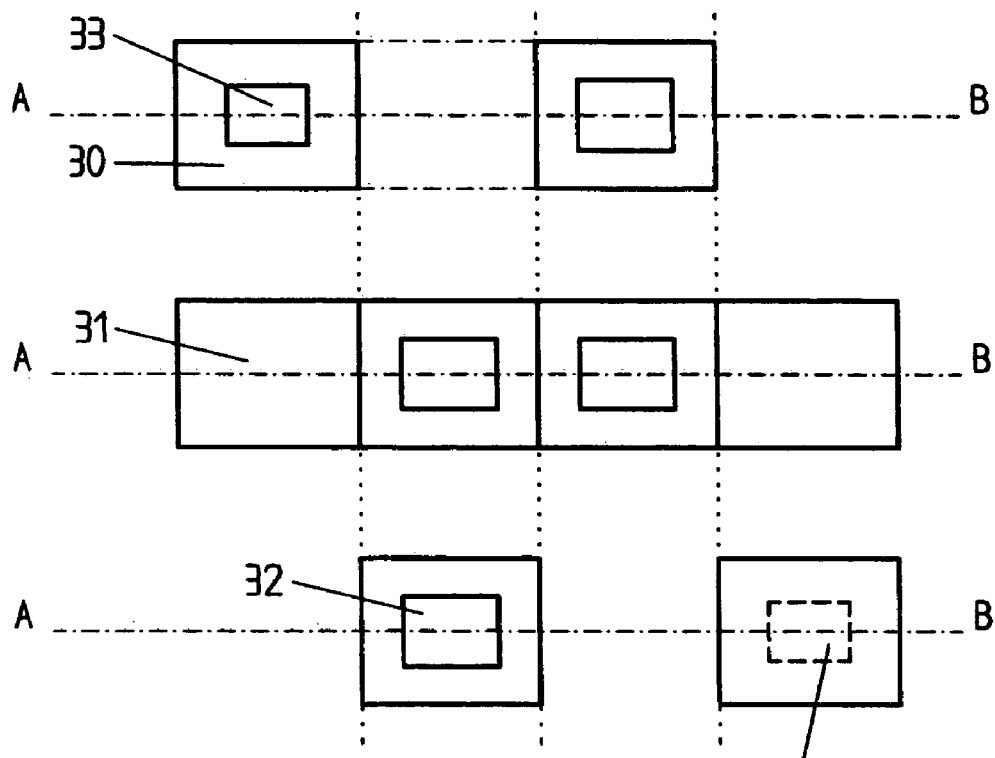
FIG. 14 illustrates a processed laminate in layer by layer fashion as seen from the top with a top side conductor layer 30, an insulator 31 and a bottom side conductor layer 32, some components 33, 34 having also been connected to said laminate.
Figure 15:
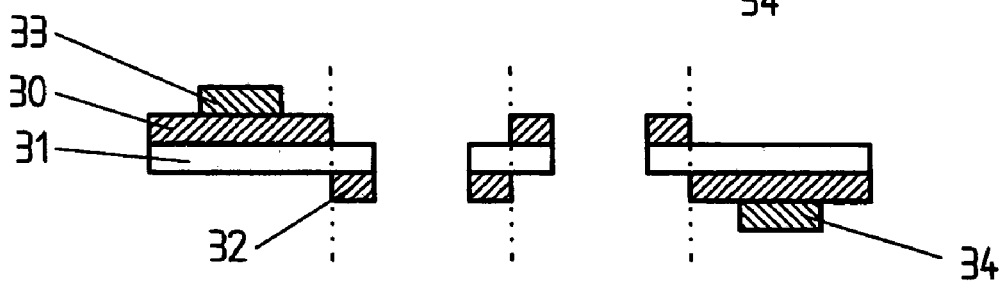
FIG. 15 illustrates the side projection of the laminate of FIG. 14 along projection A-B.
Figure 16:
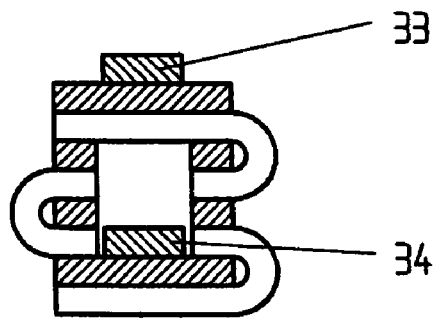
FIG. 16 illustrates a folded multilayer structure which also has electrical components 33, 34 in it.

In another embodiment of the invention, the multilayer structure includes besides the conductor and insulator layers other electrical components assembled therein. FIG. 14 illustrates a processed laminate with various layers separated from each other. The top side conductor layer 30 has a component 33 mounted on it and, similarly, the bottom side conductor 32 has a component 34 on it. The conductor layers 30 and 32 and the insulator layer have large material removal apertures in them. The side projection along A-B is shown in FIG. 15. FIG. 16 illustrates a multilayer structure where a first component 33 is outside the structure and a second component 34 is inside a cavity formed by the apertures in the conductor and insulator layers. Burying components inside multilayer structures reduces the size of the assemblage. It is also possible to shield noise components inside the structure to reduce electromagnetic interference.

The components can be traditional through-hole or surface-mounted components or more advanced flip-chip components and passive thin and thick film components. It is especially beneficial to include components of switched mode power supplies into the inductive components. The insulator can also be used for guiding light, for example for communication between different parts of the structure. The cavities which can be formed inside the structure can be used for cooling. Especially the increase of the structure surface area by cavities or apertures promotes cooling.

The invention claimed is:

1. A multilayer circuit comprising a flexible sheet of insulating material having two sides, and
    at least one first conductive layer laminated to a first side of said flexible sheet and at least one second conductive layer laminated to a second side of said flexible sheet,
    wherein said flexible sheet is folded along folding lines, which divide said flexible sheet into consecutive segments, in order to form a multilayer structure having conductor layers formed by the at least one first conductive layer and the at least one second conductive layer and insulator layers of the flexible sheet of insulating material stacked above each other, the at least one first conductive layer and the at least one second conductive layer being interconnected to form an electric circuit, and
    wherein at least two consecutive layers of the electric circuit that must be insulated from each other are disposed on different sides of said flexible sheet.

2. The circuit of claim 1, wherein at least one of the at least one first conductive layer and the at least one second conductive layer comprise conductive elements.

3. The circuit of claim 1, wherein at least one of the at least one first conductive layer and the at least one second conductive layer comprise metallic conductors.

4. The circuit of claim 1, wherein consecutive sections of electric circuit that must be insulated from each other are insulated by one single ply of said flexible sheet.

5. The circuit of claim 4, configured to form an inductor or an electrical transformer or an electrical filter.

6. The circuit of claim 4, including at least one cavity and apertures.

7. The circuit of claim 4, wherein layers of electric circuit that must not be insulated from each other lie on the same side of said folding flexible sheet, on adjacent segments of said flexible sheet.

8. The circuit of claim 4, wherein said at least two consecutive layers of electric circuit that must be insulated from each other lie on opposite sides of said folding flexible sheet, on adjacent segments of said flexible sheet.

9. The circuit of claim 4, wherein said at least one of said at least one first conductive layer and said at least one second conductive layer has a discontinuity in correspondence with the folding lines, in order to guide the folding.

10. The circuit of claim 4, including magnetic and/or electric and/or electronic components.

11. The circuit of claim 10, wherein said components are inside said multilayer structure.

12. The circuit of claim 4, comprising electrical connection means between said at least one first conductive layer and said at least one second conductive layer.

13. The circuit of claim 12, further comprising apertures in said flexible sheet in correspondence with said electrical connection means.

14. The circuit of claim 12, wherein said electrical connection means is a rivet.

15. The circuit of claim 12, wherein said electrical connection means is a solder joint or a solder layer.

* * * * *